(12) United States Patent
Dede et al.

(10) Patent No.: US 8,427,832 B2
(45) Date of Patent: Apr. 23, 2013

(54) COLD PLATE ASSEMBLIES AND POWER ELECTRONICS MODULES

(75) Inventors: Ercan Mehmet Dede, Ann Arbor, MI (US); Yan Liu, Canton, MI (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 319 days.

(21) Appl. No.: 12/984,905

(22) Filed: Jan. 5, 2011

(65) Prior Publication Data

US 2012/0170222 A1 Jul. 5, 2012

(51) Int. Cl.
*H05K 7/20* (2006.01)

(52) U.S. Cl.
USPC ........... 361/702; 361/699; 361/703; 361/717; 361/718; 165/80.4; 165/104.33

(58) Field of Classification Search .................. None
See application file for complete search history.

(56) References Cited

U.S. PATENT DOCUMENTS

| | | | |
|---|---|---|---|
| 4,322,737 A | 3/1982 | Sliwa, Jr. |
| 4,392,153 A | 7/1983 | Glascock, II et al. |
| 4,420,739 A | 12/1983 | Herren |
| 4,494,171 A | 1/1985 | Bland et al. |
| 4,733,293 A | 3/1988 | Gabuzda |
| 4,748,495 A | 5/1988 | Kucharek |
| 4,783,721 A | 11/1988 | Yamamoto et al. |
| 4,868,712 A | 9/1989 | Woodman |
| 4,920,574 A | 4/1990 | Yamamoto et al. |
| 4,956,746 A | 9/1990 | Gates, Jr. et al. |
| 5,016,138 A | 5/1991 | Woodman |
| 5,023,695 A | 6/1991 | Umezawa et al. |
| 5,079,619 A | 1/1992 | Davidson |
| 5,088,005 A | 2/1992 | Ciaccio |
| 5,119,175 A | 6/1992 | Long et al. |
| 5,145,001 A | 9/1992 | Valenzuela |
| 5,210,440 A | 5/1993 | Long |
| 5,228,502 A | 7/1993 | Chu et al. |
| 5,260,850 A | 11/1993 | Sherwood et al. |
| 5,269,372 A | 12/1993 | Chu et al. |
| 5,270,572 A | 12/1993 | Nakajima et al. |

(Continued)

OTHER PUBLICATIONS

U.S. Appl. No. 12/880,386, filed Sep. 13, 2010, titled: Jet Impingement Heat Exchanger Apparatuses and Power Electronics Modules.

(Continued)

*Primary Examiner* — Boris Chervinsky
(74) *Attorney, Agent, or Firm* — Dinsmore & Shohl LLP

(57) ABSTRACT

A cold plate assembly includes an inlet manifold layer, a target heat transfer layer, a second-pass heat transfer layer, and an outlet manifold layer. The inlet manifold layer includes a coolant fluid outlet and an inlet channel. The inlet channel includes a plurality of fluid inlet holes fluidly coupled to a plurality of impingement jet nozzles. The target heat transfer layer includes a plurality of target heat transfer cells having a plurality of target heat transfer layer microchannels extending in a radial direction from a central impingement region. The second-pass heat transfer layer includes a plurality of second-pass heat transfer cells having a plurality of second-pass heat transfer layer microchannels extending in a radial direction toward a central fluid outlet region, and one or more transition channels. The impingement jet nozzles are positioned through the central fluid outlet region. The outlet manifold layer includes an outlet channel having a plurality of fluid outlet holes.

20 Claims, 12 Drawing Sheets

U.S. PATENT DOCUMENTS

| | | | |
|---|---|---|---|
| 5,394,299 A | 2/1995 | Chu et al. | |
| 5,546,274 A | 8/1996 | Davidson | |
| 5,912,800 A | 6/1999 | Sammakia et al. | |
| 5,983,997 A | 11/1999 | Hou | |
| 6,058,010 A | 5/2000 | Schmidt et al. | |
| 6,152,215 A | 11/2000 | Niggemann | |
| 6,167,948 B1 | 1/2001 | Thomas | |
| 6,167,952 B1 | 1/2001 | Downing | |
| 6,242,075 B1 | 6/2001 | Chao et al. | |
| 6,305,463 B1 | 10/2001 | Salmonson | |
| 6,333,853 B2 | 12/2001 | O'Leary et al. | |
| 6,377,461 B1 | 4/2002 | Ozmat et al. | |
| 6,386,278 B1 | 5/2002 | Schulz-Harder | |
| 6,431,260 B1 | 8/2002 | Agonafer et al. | |
| 6,459,581 B1 | 10/2002 | Newton et al. | |
| 6,501,654 B2 | 12/2002 | O'Connor et al. | |
| 6,580,609 B2 | 6/2003 | Pautsch | |
| 6,665,185 B1 | 12/2003 | Kulik et al. | |
| 6,828,675 B2 | 12/2004 | Memory et al. | |
| 6,903,931 B2 | 6/2005 | McCordic et al. | |
| 6,942,018 B2 | 9/2005 | Goodson et al. | |
| 6,952,346 B2 | 10/2005 | Tilton et al. | |
| 6,972,365 B2 | 12/2005 | Garner | |
| 6,986,382 B2 | 1/2006 | Upadhya et al. | |
| 6,988,535 B2 | 1/2006 | Upadhya et al. | |
| 6,992,382 B2 | 1/2006 | Chrysler et al. | |
| 6,994,151 B2 | 2/2006 | Zhou et al. | |
| 7,009,842 B2 * | 3/2006 | Tilton et al. | 361/699 |
| 7,017,654 B2 | 3/2006 | Kenny et al. | |
| 7,058,101 B2 | 6/2006 | Treusch et al. | |
| 7,071,408 B2 | 7/2006 | Garner | |
| 7,104,312 B2 | 9/2006 | Goodson et al. | |
| 7,114,550 B2 * | 10/2006 | Nakahama et al. | 165/80.4 |
| 7,119,284 B2 | 10/2006 | Bel et al. | |
| 7,184,269 B2 | 2/2007 | Campbell et al. | |
| 7,188,662 B2 | 3/2007 | Brewer et al. | |
| 7,204,303 B2 | 4/2007 | Thomas et al. | |
| 7,205,653 B2 | 4/2007 | Brandenburg et al. | |
| 7,212,409 B1 | 5/2007 | Belady et al. | |
| 7,250,674 B2 | 7/2007 | Inoue | |
| 7,295,440 B2 | 11/2007 | Ganev et al. | |
| 7,298,617 B2 | 11/2007 | Campbell et al. | |
| 7,298,618 B2 | 11/2007 | Campbell et al. | |
| 7,301,772 B2 | 11/2007 | Tilton et al. | |
| 7,302,998 B2 | 12/2007 | Valenzuela | |
| 7,327,570 B2 | 2/2008 | Belady | |
| 7,336,493 B2 | 2/2008 | Berkenbush et al. | |
| 7,355,277 B2 | 4/2008 | Myers et al. | |
| 7,365,981 B2 | 4/2008 | Myers et al. | |
| 7,385,817 B2 | 6/2008 | Campbell et al. | |
| 7,393,226 B2 | 7/2008 | Clayton et al. | |
| 7,397,662 B2 | 7/2008 | Oyamada | |
| 7,400,504 B2 | 7/2008 | Campbell et al. | |
| 7,414,844 B2 | 8/2008 | Wilson et al. | |
| 7,429,792 B2 | 9/2008 | Lee et al. | |
| 7,435,623 B2 | 10/2008 | Chrysler et al. | |
| 7,450,378 B2 | 11/2008 | Nelson et al. | |
| 7,486,514 B2 | 2/2009 | Campbell et al. | |
| 7,495,916 B2 | 2/2009 | Shiao et al. | |
| 7,551,439 B2 | 6/2009 | Peugh et al. | |
| 7,599,184 B2 | 10/2009 | Upadhya et al. | |
| 7,608,924 B2 | 10/2009 | Myers et al. | |
| 7,679,911 B2 | 3/2010 | Rapp | |
| 7,738,249 B2 | 6/2010 | Chan et al. | |
| 7,795,726 B2 | 9/2010 | Myers et al. | |
| 7,808,780 B2 | 10/2010 | Brunschwiler et al. | |
| 7,830,664 B2 | 11/2010 | Campbell et al. | |
| 7,835,151 B2 * | 11/2010 | Olesen | 361/689 |
| 7,839,642 B2 | 11/2010 | Martin | |
| 7,940,526 B2 | 5/2011 | Schulz-Harder et al. | |
| 7,952,875 B2 | 5/2011 | Woody et al. | |
| 8,077,460 B1 * | 12/2011 | Dede et al. | 361/699 |
| 8,081,461 B2 * | 12/2011 | Campbell et al. | 361/700 |
| 8,199,505 B2 * | 6/2012 | Dede | 361/702 |
| 8,243,451 B2 | 8/2012 | Dede et al. | |
| 2002/0053726 A1 | 5/2002 | Mikubo et al. | |
| 2003/0196451 A1 | 10/2003 | Goldman et al. | |
| 2005/0121180 A1 | 6/2005 | Marsala | |
| 2005/0199372 A1 | 9/2005 | Frazer et al. | |
| 2005/0225938 A1 | 10/2005 | Montgomery et al. | |
| 2006/0002086 A1 | 1/2006 | Teneketges et al. | |
| 2006/0291164 A1 | 12/2006 | Myers et al. | |
| 2007/0034360 A1 | 2/2007 | Hall | |
| 2007/0041160 A1 | 2/2007 | Kehret et al. | |
| 2007/0074856 A1 | 4/2007 | Bhatti et al. | |
| 2007/0114656 A1 | 5/2007 | Brandenburg et al. | |
| 2007/0119565 A1 | 5/2007 | Brunschwiler et al. | |
| 2007/0177352 A1 | 8/2007 | Monfarad et al. | |
| 2007/0188991 A1 | 8/2007 | Wilson et al. | |
| 2007/0230127 A1 | 10/2007 | Peugh et al. | |
| 2007/0236883 A1 | 10/2007 | Ruiz | |
| 2008/0093053 A1 | 4/2008 | Song et al. | |
| 2008/0245506 A1 | 10/2008 | Campbell et al. | |
| 2009/0032937 A1 | 2/2009 | Mann et al. | |
| 2009/0090490 A1 | 4/2009 | Yoshida et al. | |
| 2009/0108439 A1 | 4/2009 | Brandenburg et al. | |
| 2009/0294106 A1 | 12/2009 | Flotta et al. | |
| 2010/0000766 A1 | 1/2010 | Loiselet et al. | |
| 2010/0038774 A1 | 2/2010 | Zhang et al. | |
| 2010/0142150 A1 | 6/2010 | Campbell et al. | |
| 2010/0242178 A1 | 9/2010 | Goetting | |
| 2010/0246117 A1 | 9/2010 | Brunschwiler et al. | |
| 2010/0277868 A1 | 11/2010 | Beaupre et al. | |
| 2011/0216502 A1 | 9/2011 | Dede | |
| 2012/0048515 A1 | 3/2012 | Bhunia et al. | |
| 2012/0063091 A1 * | 3/2012 | Dede et al. | 361/699 |

OTHER PUBLICATIONS

U.S. Appl. No. 12/839,039, filed Jul. 19, 2010, titled: Heat Exchanger Fluid Distribution Manifolds and Power Electronics Modules Incorporating the Same.
U.S. Appl. No. 12/880,422, filed Sep. 13, 2010, titled: Cooling Apparatuses and Power Electronics Modules.
U.S. Appl. No. 13/029,216, filed Feb. 17, 2011, Notice of Allowance mailed Nov. 13, 2012.

* cited by examiner

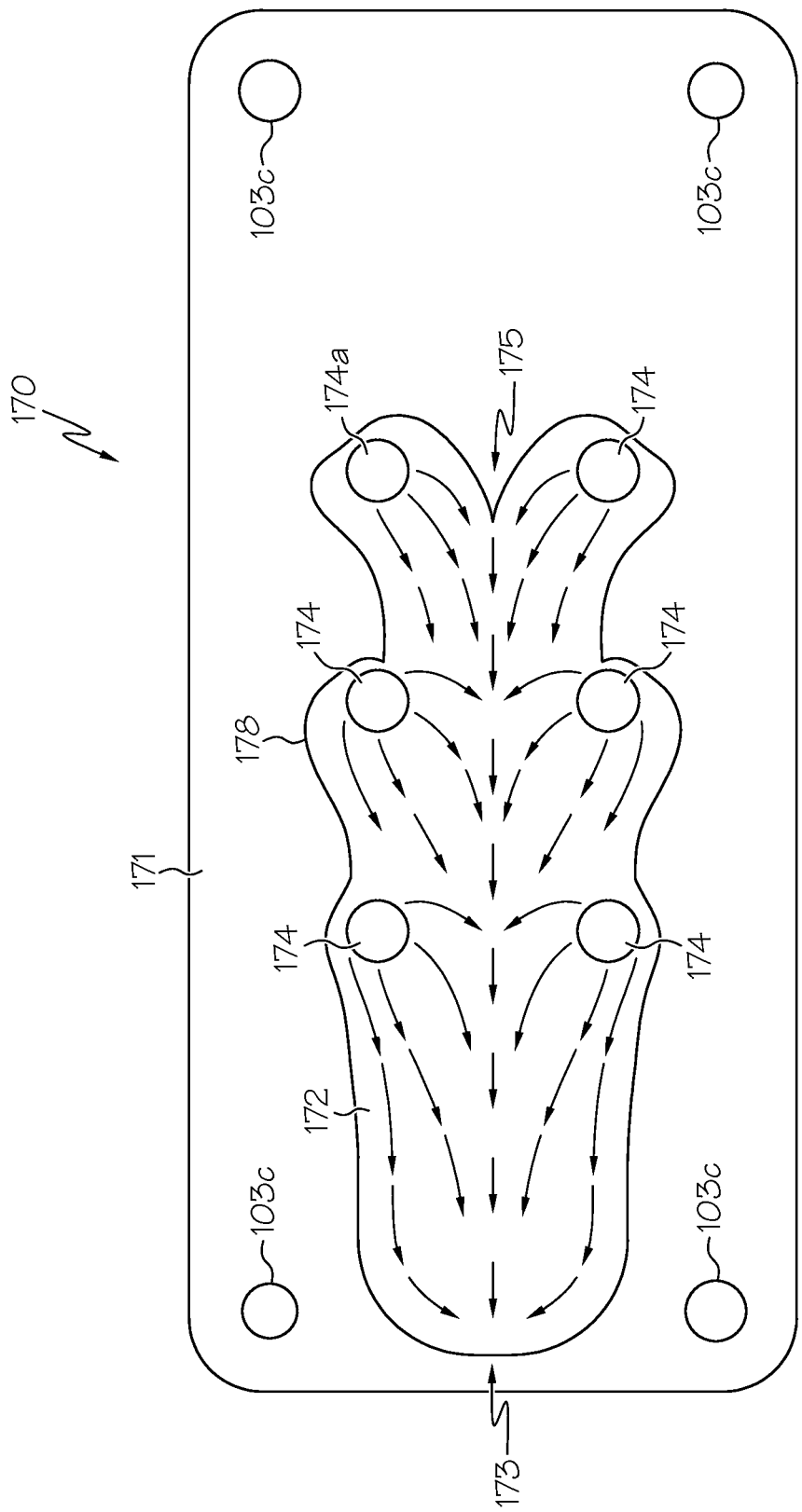

COLD PLATE ASSEMBLIES AND POWER ELECTRONICS MODULES

CROSS REFERENCE TO RELATED APPLICATIONS

This application is related to U.S. patent application Ser. No. 12/839,039 entitled "Heat Exchanger Fluid Distribution Manifolds and Power Electronics Modules Incorporating the Same," filed on Jul. 19, 2010, which is hereby incorporated by reference in its entirety, but does not claim priority thereto. This application is also related to U.S. patent application Ser. No. 12/880,386 entitled "Jet Impingement Heat Exchanger Apparatuses and Power Electronics Modules," filed on Sep. 13, 2010, which is hereby incorporated by reference in its entirety, but does not claim priority thereto.

TECHNICAL FIELD

The present specification generally relates to cold plate assemblies and more particularly, multi-layered cold plate assemblies and power electronics modules incorporating the same.

BACKGROUND

Heat sinking devices may be coupled to a heat generating device, such as a power electronics device, to remove heat and lower the maximum operating temperature of the heat generating device. Cooling fluid may be used to receive heat generated by the heat generating device by convective thermal transfer, and remove such heat from the heat generating device. For example, a jet of cooling fluid may be directed such that it impinges a surface of the heat generating device. Another way to remove heat from a heat generating device is to couple the device to a finned heat sink made of a thermally conductive material, such as aluminum.

However, as power electronics are designed to operate at increased power levels and generate increased corresponding heat flux due to the demands of newly developed electrical systems, conventional heat sinks are unable to adequately remove the heat flux to effectively lower the operating temperature of the power electronics to acceptable temperature levels.

Accordingly, a need exists for alternative cold plate assemblies and power electronics modules for removing heat flux from heat generating devices.

SUMMARY

In one embodiment, a cold plate assembly includes a coolant fluid inlet, an inlet manifold layer, a target heat transfer layer, a second-pass heat transfer layer, and an outlet manifold layer. The inlet manifold layer includes a coolant fluid outlet and an inlet channel. The inlet channel includes a plurality of fluid inlet holes fluidly coupled to a plurality of impingement jet nozzles. At least two fluid inlet holes of the plurality of fluid inlet holes are separated from the coolant fluid inlet by an unequal distance, and an inlet coolant fluid flow rate of a coolant fluid at each fluid inlet hole is substantially uniform. The target heat transfer layer includes a plurality of target heat transfer cells, each target heat transfer cell having a plurality of target heat transfer layer fins that define a plurality of target heat transfer layer microchannels extending in a radial direction from a central impingement region. The second-pass heat transfer layer includes a plurality of second-pass heat transfer cells, each second-pass heat transfer cell having a plurality of second-pass heat transfer layer fins that define a plurality of second-pass heat transfer layer microchannels extending in a radial direction toward a central fluid outlet region, and one or more transition channels positioned between each second-pass heat transfer cell. The second-pass heat transfer layer is thermally coupled to the target heat transfer layer, and the transition channels fluidly couple the second-pass heat transfer layer to the target heat transfer layer. The plurality of impingement jet nozzles is positioned through the central fluid outlet region of the second-pass heat transfer cells. The outlet manifold layer includes an outlet channel having a plurality of fluid outlet holes. The outlet manifold layer is thermally coupled to the second-pass heat transfer layer and the inlet manifold layer, and the outlet channel is fluidly coupled to the coolant fluid outlet. The plurality of impingement jet nozzles passes through the plurality of fluid outlet holes.

In another embodiment, a power electronics module includes a cold plate assembly thermally coupled to a power electronics device by a substrate layer. The cold plate assembly includes a coolant fluid inlet, an inlet manifold layer, a target heat transfer layer, a second-pass heat transfer layer, and an outlet manifold layer. The inlet manifold layer includes a coolant fluid outlet and an inlet channel. The inlet channel includes a plurality of fluid inlet holes fluidly coupled to a plurality of impingement jet nozzles. At least two fluid inlet holes of the plurality of fluid inlet holes are separated from the coolant fluid inlet by an unequal distance, and an inlet coolant fluid flow rate of a coolant fluid at each fluid inlet hole is substantially uniform. The target heat transfer layer includes a plurality of target heat transfer cells, each target heat transfer cell having a plurality of target heat transfer layer fins that define a plurality of target heat transfer layer microchannels extending in a radial direction from a central impingement region. The second-pass heat transfer layer includes a plurality of second-pass heat transfer cells, each second-pass heat transfer cell having a plurality of second-pass heat transfer layer fins that define a plurality of second-pass heat transfer layer microchannels extending in a radial direction toward a central fluid outlet region, and one or more transition channels positioned between each second-pass heat transfer cell. The second-pass heat transfer layer is thermally coupled to the target heat transfer layer, and the transition channels fluidly couple the second-pass heat transfer layer to the target heat transfer layer. The plurality of impingement jet nozzles is positioned through the central fluid outlet region of the second-pass heat transfer cells. The outlet manifold layer includes an outlet channel having a plurality of fluid outlet holes. The outlet manifold layer is thermally coupled to the second-pass heat transfer layer and the inlet manifold layer, and the outlet channel is fluidly coupled to the coolant fluid outlet. The plurality of impingement jet nozzles passes through the plurality of fluid outlet holes. The substrate layer is coupled to a backside of the target heat transfer layer. Heat generated by the power electronics device is transferred to the coolant fluid within the cold plate assembly at least through the substrate layer and the target heat transfer layer.

In yet another embodiment, a cold plate assembly includes an inlet manifold layer, a target heat transfer layer, a second-pass heat transfer layer and an outlet manifold layer. The inlet manifold layer includes a coolant fluid outlet and an inlet channel having a plurality of fluid inlet holes fluidly coupled to a plurality of impingement jet nozzles, and a plurality of serpentine inlet channel walls. The target heat transfer layer includes a plurality of target heat transfer cells, each target heat transfer cell having a plurality of target heat transfer layer fins having curved walls that define a plurality of target heat transfer layer microchannels extending outwardly in a radial direction from a central impingement region. The second-pass heat transfer layer includes a plurality of second-pass heat transfer cells, each second-pass heat transfer cell having a plurality of second-pass heat transfer layer fins having curved walls that define a plurality of second-pass heat transfer layer microchannels extending inwardly in a radial direction toward a central fluid outlet region, and one or more transition channels positioned between each second-pass heat transfer cell. The second-pass heat transfer layer is thermally coupled to the target heat transfer layer, and the transition channels fluidly couple the second-pass heat transfer layer to the target heat transfer layer. The plurality of impingement jet nozzles is positioned through the central fluid outlet region of the second-pass heat transfer cells. The outlet manifold layer includes an outlet channel having a plurality of fluid outlet holes and a plurality of serpentine outlet channel walls. The outlet manifold layer is thermally coupled to the second-pass heat transfer layer and the inlet manifold layer, the outlet channel is fluidly coupled to the coolant fluid outlet, and the plurality of impingement jet nozzles passes through the plurality of fluid outlet holes. A target layer microchannel pattern that is defined by the plurality of target heat transfer layer microchannels is different from a heat transfer layer microchannel pattern that is defined by the plurality of second-pass heat transfer layer microchannels.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

FIG. 4C schematically depicts a coolant fluid flow pattern of the outlet manifold layer depicted in FIGS. 4A and 4B;

DETAILED DESCRIPTION

Figure 1A:
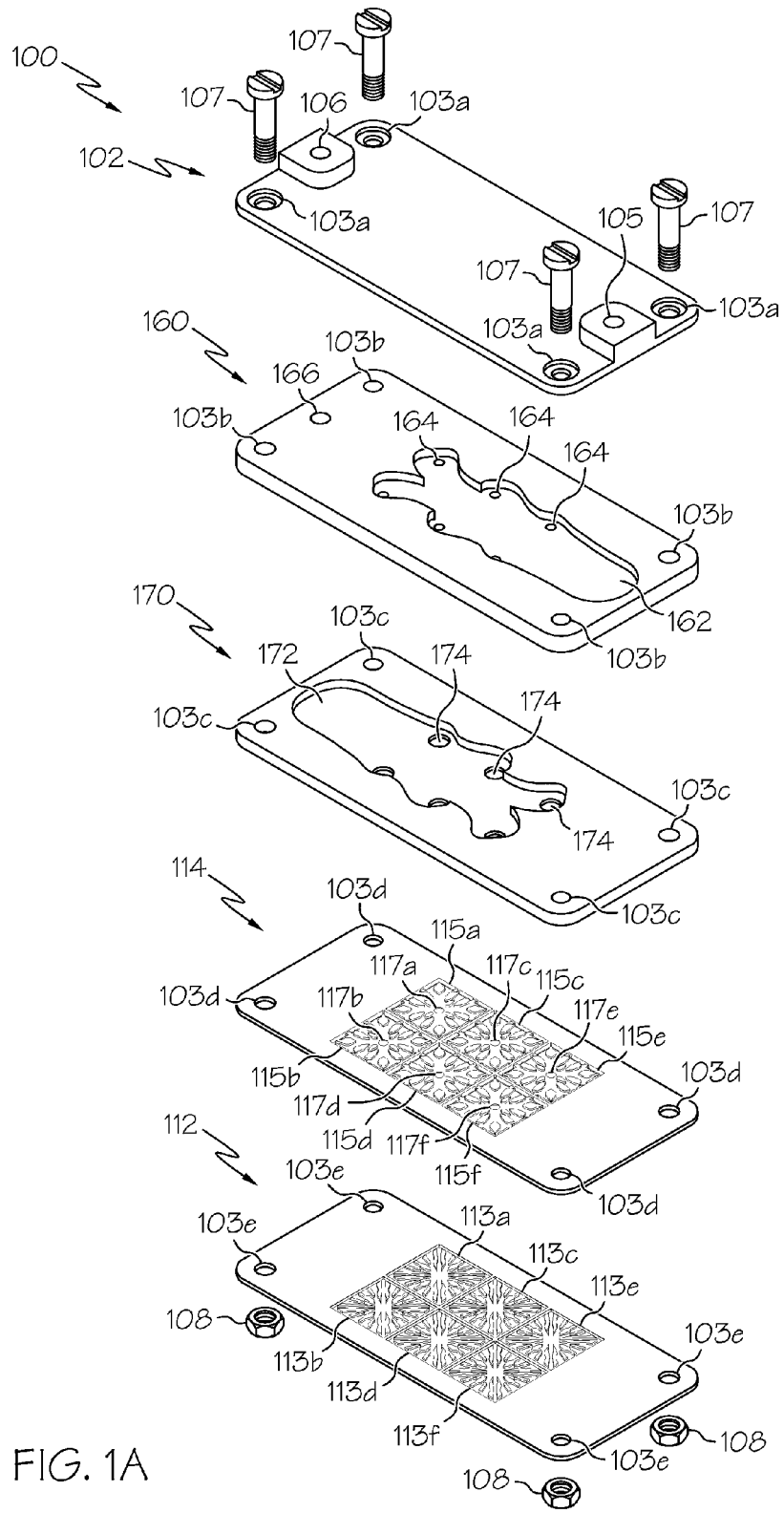
FIG. 1A schematically depicts an exploded perspective view of a cold plate assembly according to one or more embodiments shown and described herein.

FIG. 1A generally depicts one embodiment of a cold plate assembly for removing heat flux produced by a heat generating device such as a power semiconductor device. The cold plate assembly provides multiple layers for heat exchange while also optimizing fluid flow for low pressure drops within the assembly. The cold plate assembly generally comprises a sealing layer having a coolant fluid inlet and a coolant fluid outlet, an inlet manifold layer, a target heat transfer layer, a second-pass heat transfer layer, and an outlet manifold layer. Coolant fluid enters the cold plate assembly from the coolant fluid inlet and enters multiple impingement jet nozzles that produce a jet of coolant fluid that impinges target heat transfer cells on the target heat transfer layer. The coolant fluid flows outwardly in a radial direction and flows into second-pass heat transfer cells of the second-pass heat transfer layer through one or more transition channels. At the second-pass heat transfer layer, the coolant fluid flows inwardly in a radial direction and then into the outlet manifold layer where it exits the cold plate assembly through the coolant fluid outlet. The multi-pass feature provides for enhanced cooling as the coolant fluid is in contact with more surface area and experiences fluid mixing at the transition channel. Embodiments combine features of an impingement-jet structure and a channel-based structure to create multi-layered heat exchanger structures for single- or double-sided cooling. Further, optimized serpentine walls of the inlet manifold layer and the outlet manifold layer provide for low pressure drops within the cold plate assemblies and power electronics modules. Various embodiments of cold plate assemblies, power electronics modules and operations thereof will be described in more detail herein.

Figure 1B:
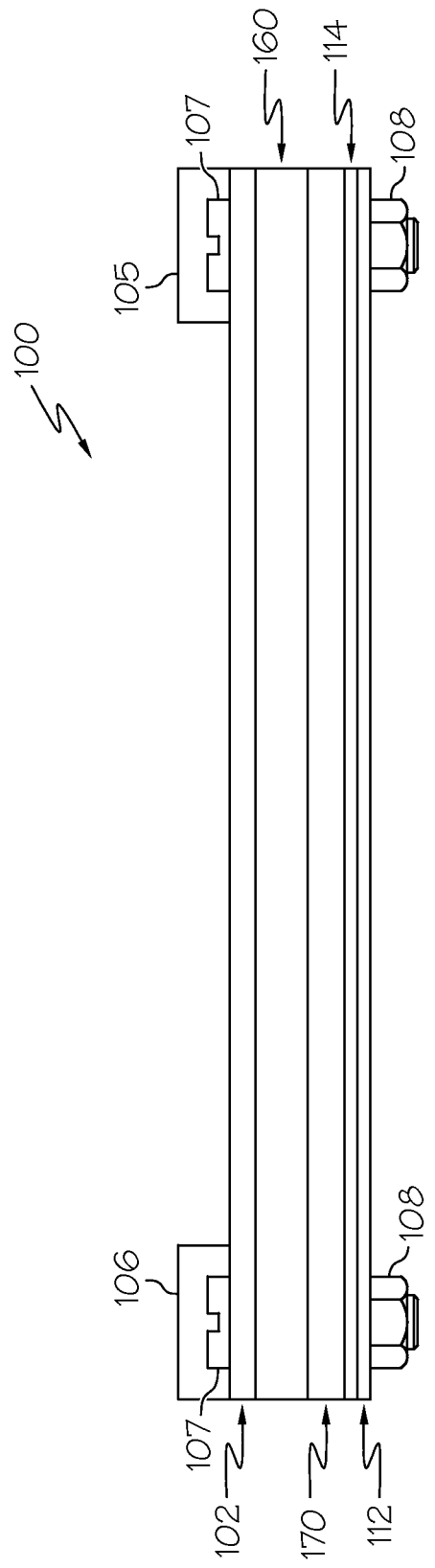
FIG. 1B schematically depicts a side view of the cold plate assembly depicted in FIG. 1A.

Referring now to FIGS. 1A and 1B, an exemplary cold plate assembly 100 is illustrated. FIG. 1A is an exploded view of an embodiment of a cold plate assembly 100 and FIG. 1B is a side view of the cold plate assembly depicted in FIG. 1A. Generally, the cold plate assembly 100 comprises a sealing layer 102 that is thermally coupled to an inlet manifold layer 160. The term thermally coupled means that heat flux produced by a heat generating device may transfer between one layer to the next. It is noted that the various layers described herein may be thermally coupled to one another and fluidly sealed by a variety of methods. For example, the sealing layer 102 may be thermally coupled to the inlet manifold layer 160 by a brazing process in which a thin metal alloy is used to form a braze between the two structures. Solder bonding, diffusion bonding, or ultrasonic bonding may also be utilized to thermally couple the various layers. As illustrated in FIGS. 1A and 1B, fasteners such as bolts 107 and nuts 108 may also be utilized along with o-rings or gaskets (not shown) to maintain the various layers in a thermally-coupled and fluidly-sealed relationship.

The cold plate assembly 100 further comprises an outlet manifold layer 170 that is thermally coupled to the inlet manifold layer 160, a second-pass heat transfer layer 114 that is thermally coupled to the outlet manifold layer 170, and a target heat transfer layer 112 that is thermally coupled to the second-pass heat transfer layer 114. As depicted in FIG. 1B, all of the layers are stacked together to form a cold plate assembly 100 that may be coupled to a power electronics device at the target heat transfer layer 112.

Figure 2:
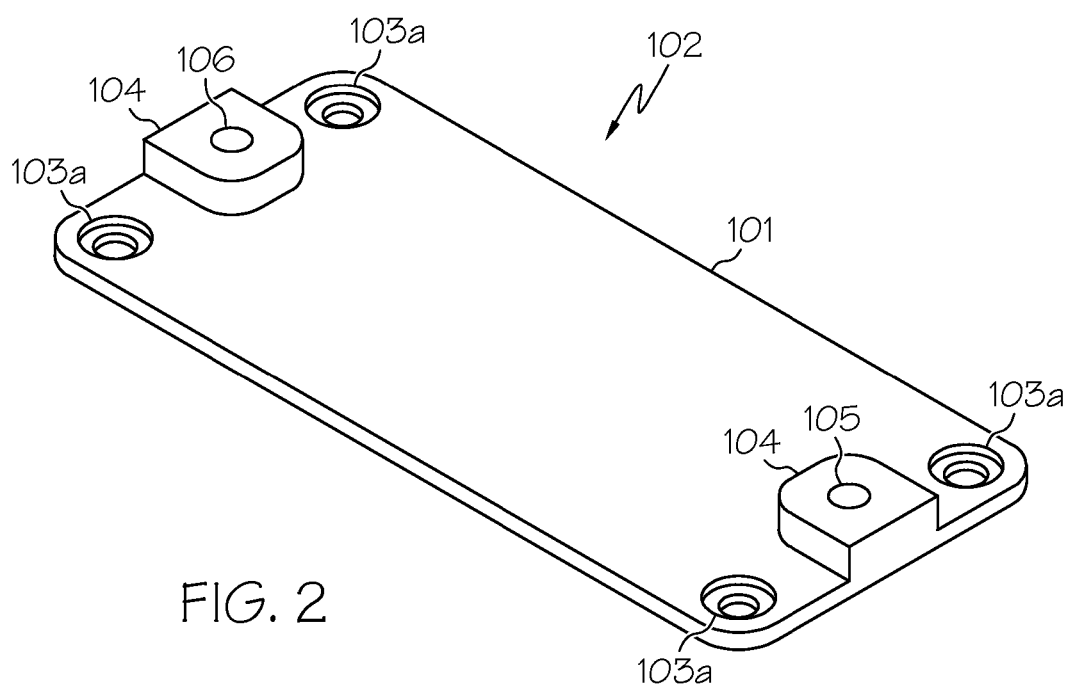
FIG. 2 schematically depicts a top perspective view of a sealing layer according to one or more embodiments shown and described herein.

Referring now to FIGS. 1A and 2, the sealing layer 102 comprises a fluid inlet 105 and a sealing layer fluid outlet 106 configured as holes that extend fully through the sealing layer 102. The coolant fluid inlet 105 and the sealing layer fluid outlet 106 that may have a variety of configurations that enable coolant fluid to enter and exit the cold plate assembly 100. For example, the coolant fluid inlet 105 and sealing layer fluid outlet 106 may further comprise coupling hardware to couple the coolant fluid inlet 105 and the sealing layer fluid outlet 106 to a fluid input line (not shown) and a coolant fluid output line (not shown), respectively. The coolant fluid input and output lines may be connected to a coolant fluid source (not shown), such as a radiator of a vehicle or other similar coolant fluid reservoir. The coolant fluid may be any type of fluid used for heat exchanging applications, such as ethylene-glycol mixes, water, etc. As illustrated in FIG. 1A, the sealing layer 102 may comprise mounting holes 103a that may accept bolts 107 to maintain the various layers of the cold plate assembly 100. The mounting holes 103a of the sealing layer 102 may be counter-bore holes in which the heads of the bolts 107 may be positioned. In an alternative embodiment, the sealing layer 102 may not have mounting holes and may be thermally coupled to the inlet manifold layer 160 by soldering, brazing, diffusion bonding, or ultrasonic bonding.

The sealing layer 102 may be made of a thermally conductive material including, but not limited to, copper, aluminum, thermally enhanced composite materials, and polymer composite materials. The sealing layer 102 may be formed by a variety of manufacturing processes including, but not limited to, molding processes, machining processes, stamping processes or similar processes to achieve the desired shape and configuration.

Figure 3A:
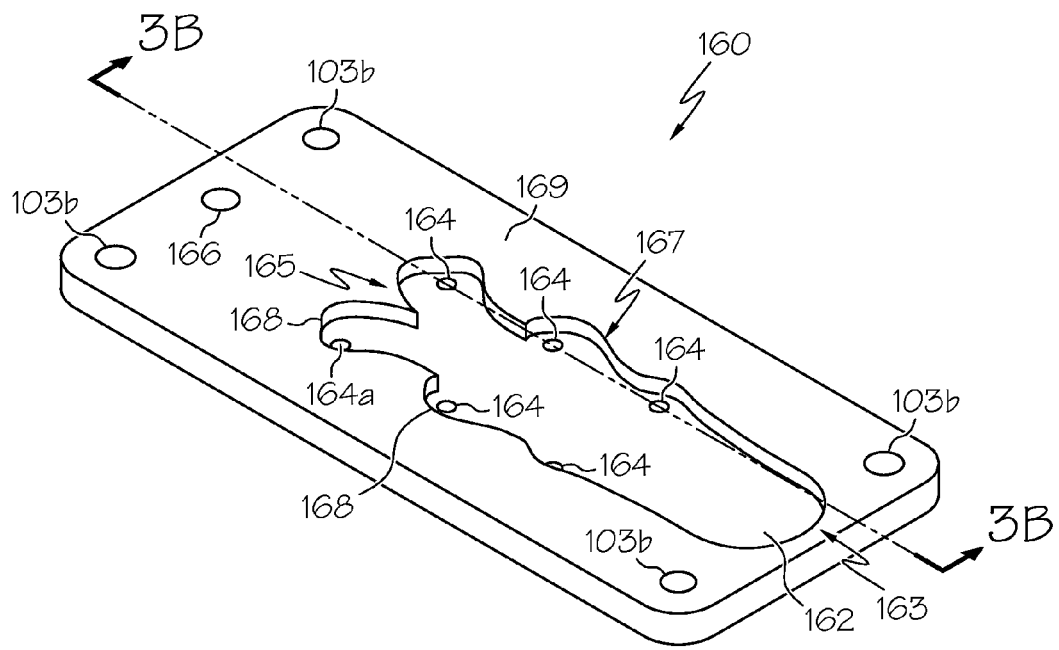
FIG. 3A schematically depicts a top perspective view of an inlet manifold layer according to one or more embodiments shown and described herein.
Figure 3B:
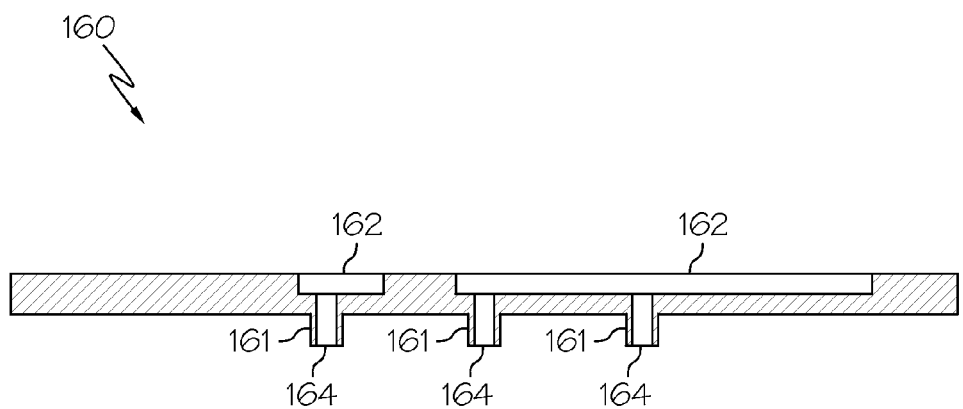
FIG. 3B schematically depicts a cross section view of the inlet manifold layer depicted in FIG. 3A.

Referring to FIGS. 1A, 3A, and 3B, the inlet manifold layer 160 generally comprises an inlet channel 162 and a coolant fluid outlet 166. The illustrated inlet manifold layer 160 further comprises mounting holes 103b operable to receive the bolts 107. The coolant fluid outlet 166 is configured as a hole that fully extends through the inlet manifold layer 160 and is positioned such that it is in fluid communication with the sealing layer fluid outlet 106 when the cold plate assembly 100 is in an assembled state.

Figure 8:
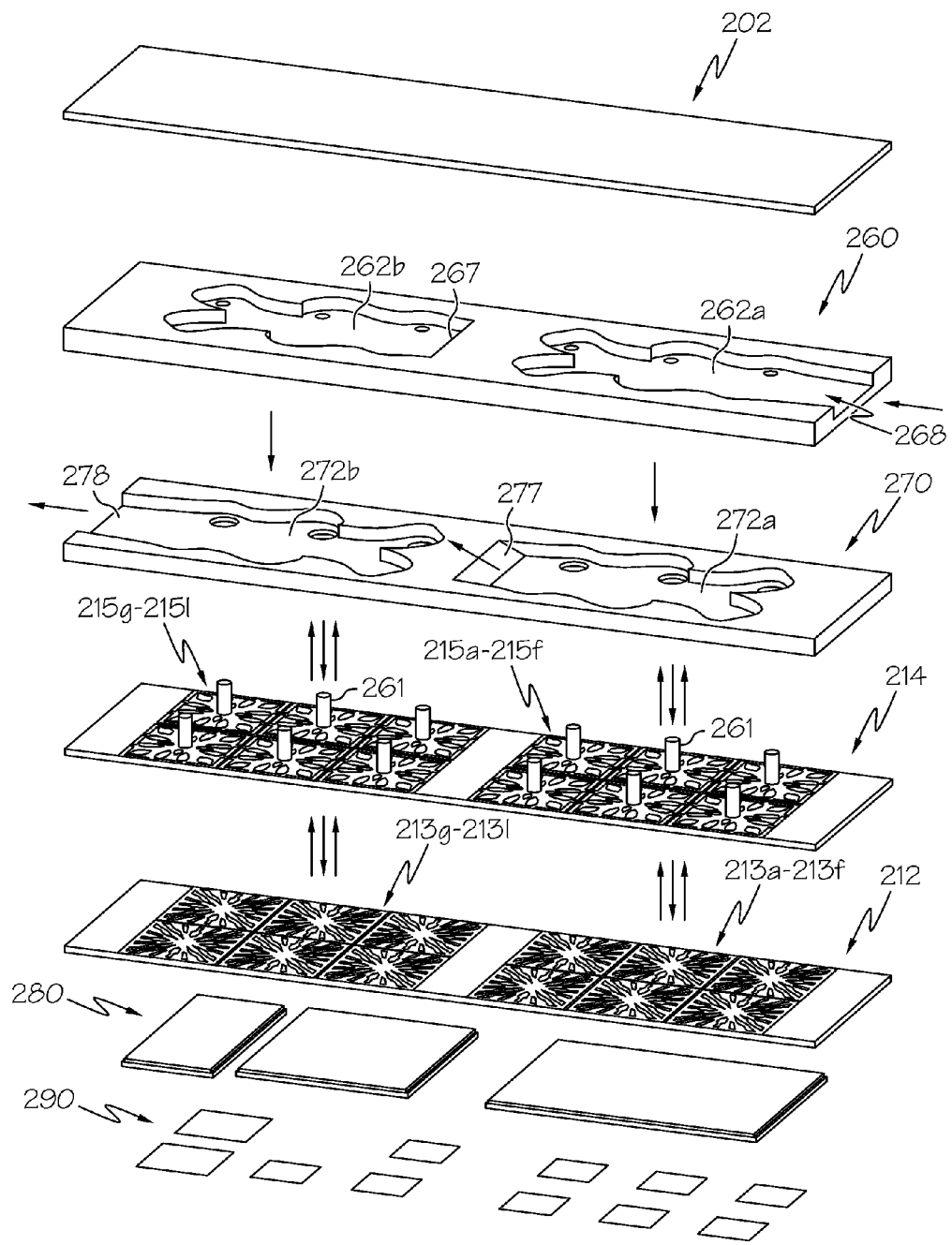
FIG. 8 schematically depicts an exploded perspective view of a cold plate assembly according to one or more embodiments shown and described herein.

The inlet channel 162 is configured as a recess within the inlet manifold layer 160 that receives coolant fluid from the coolant fluid inlet 105. As depicted in FIGS. 1A and 3A, the coolant fluid inlet 105 is in fluid communication with a first end 163 of the inlet channel 162. The illustrated inlet channel 162 comprises a plurality of fluid inlet holes 164 that are located along the inlet channel 162. The fluid inlet holes 164 extend fully through the inlet manifold layer 160. In one embodiment, as illustrated in FIG. 3B, the inlet manifold layer 160 comprises impingement jet nozzles 161 that are in fluid communication with the fluid inlet holes 164 and extend from a body 169 of the inlet manifold layer 160. The fluid inlet holes 164 extend through the cylindrical impingement jet nozzles 161 and are operable to pass coolant fluid therethrough. In another embodiment, the impingement jet nozzles 161 are incorporated as cylindrical features of the second-pass heat transfer layer 114, as illustrated in the embodiment of FIG. 8.

The inlet manifold layer 160 may be made of a thermally conductive material, and may be manufactured using a variety of manufacturing processes, as described above with respect to the sealing layer 102. As described in more detail below, the inlet manifold layer 160 is thermally coupled to the outlet manifold layer 170 such that the impingement jet nozzles 161 pass through the fluid outlet holes 174 of the outlet manifold layer 170 and either pass through the central fluid outlet regions 117 of the second-pass heat transfer layer 114 in a nesting arrangement, or rest on a surface of the heat transfer layer 114 at the central fluid outlet regions 117.

The fluid inlet holes 164 are located in two rows that extend from the first end 163 toward a second end 165 that is opposite from the first end 163. In another embodiment, the plurality of fluid inlet holes may be arranged in a single row, or in more than two rows. Further, although the embodiment illustrated in FIGS. 1A, 3A, and 3C have six fluid inlet holes 164, more or fewer fluid inlet holes 164 may be utilized.

The distance between the first end 163 where the coolant fluid enters the inlet channel 162 and the fluid inlet holes 164 varies from fluid inlet hole to fluid inlet hole. For example, the distance between the first end 163 and the fluid inlet holes 164 increases along the rows of plurality of fluid inlets toward second end 165. Because the distances between the first end 163 and the various fluid inlet holes are not equal, a coolant fluid chamber having straight walls would cause uneven coolant flow rates at each fluid inlet hole 164, as well as a relatively larger total pressure drop.

The inlet channel 162 further comprises a plurality of serpentine inlet channel walls 167. The serpentine inlet channel walls 167 are defined by a plurality of individual inlet spline features 168 that are located close to the fluid inlet holes 164. A spline feature is defined by a curved wall portion that extends from one sharp angle or transition point to another sharp angle or transition point. The shape and size of the serpentine inlet channel walls 167 and corresponding inlet spline features 168 are optimized to reduce the total pressure drop within the inlet channel 162, as well as provide for a uniform coolant fluid flow rate at each fluid inlet hole 164. The term optimized, as used herein, means that the serpentine walls are geometrically designed to provide substantially uniform coolant fluid flow rate at each fluid inlet hole. The serpentine inlet channel walls 167 are configured to guide the coolant fluid uniformly throughout the inlet channel 162.

Figure 3C:
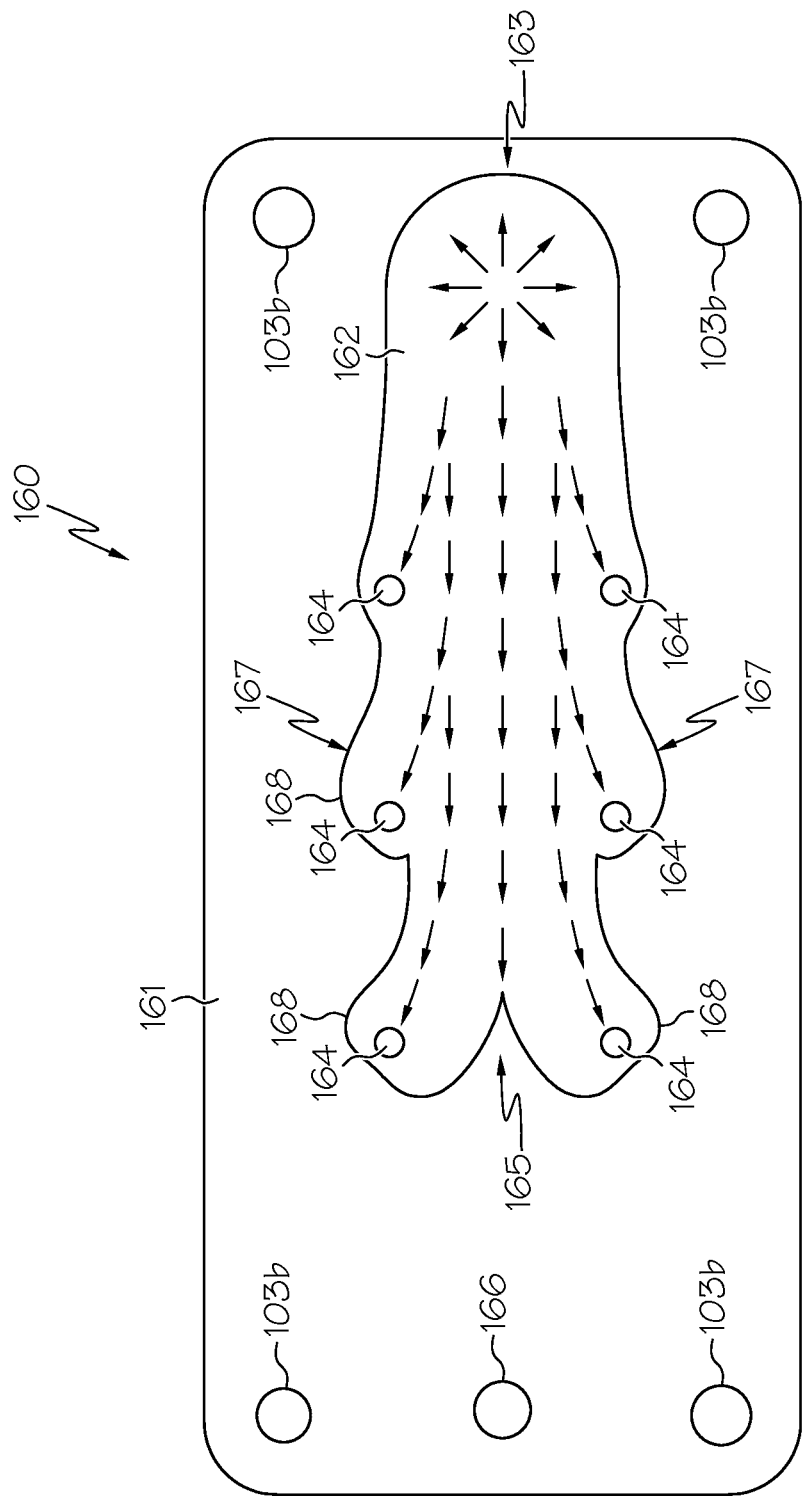
FIG. 3C schematically depicts a coolant fluid flow pattern of the inlet manifold layer depicted in FIGS. 3A and 3B.
Figure 4A:
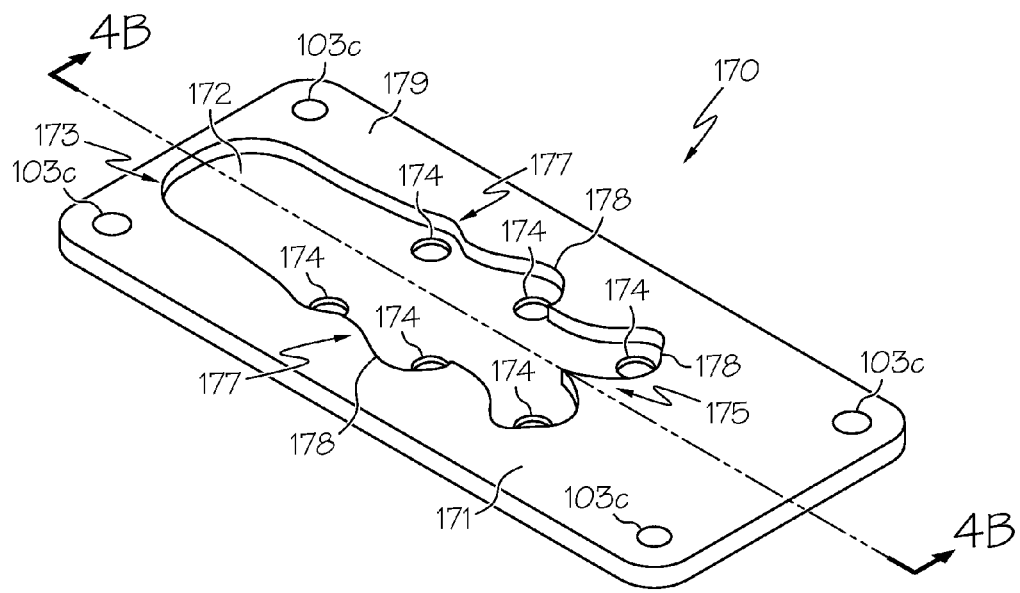
FIG. 4A schematically depicts a top perspective view of an outlet manifold layer according to one or more embodiments shown and described herein.
Figure 4B:
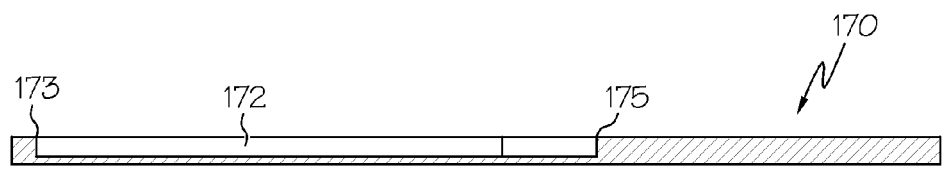
FIG. 4B schematically depicts a cross section view of the outlet manifold layer depicted in FIG. 4A.

The shape of the inlet spline features 168 is dictated by the expected flow velocity field within the inlet channel 162. FIG. 3C illustrates expected coolant fluid flow within the inlet channel 162. The arrows indicate flow direction of the coolant fluid. The coolant fluid enters the inlet channel 162 at the first end 163 and is then routed toward the fluid inlet holes 164 toward the second end 165. The embodiment illustrated in FIGS. 1 and 3A-3C utilizes the serpentine inlet channel walls 167 to optimize the area as well as the walls of the inlet channel 162 to obtain even coolant fluid flow distribution and minimize pressure loss.

The geometric shape of the serpentine inlet channel walls 167 are designed to maintain substantially equal coolant fluid velocity and pressure at the fluid inlet holes despite the unequal distances between each fluid inlet hole and the first end where the coolant fluid enters the inlet channel 162. In such a manner, coolant fluid may be evenly and efficiently distributed throughout the inlet channel 162.

In an alternative embodiment, a majority of inlet channel 162 is fully enclosed by the body 169 of the outlet manifold layer 170, and the sealing layer is not utilized. In this embodiment, the coolant fluid inlet 105 is a component of the outlet manifold layer 170. Coolant fluid may enter the inlet channel 162 via a coolant fluid inlet at the outlet manifold layer 170. This embodiment may be fabricated using a molding process, for example.

Referring now to FIGS. 1A and 4A-4C, the outlet manifold layer 170 generally comprises an outlet channel 172 and mounting holes 103c operable to receive the bolts 107. Similar to the inlet channel 162 described above, the outlet channel 172 is configured as a recess within the outlet manifold layer 170. The position of the fluid outlet holes 174 correspond to the position of the inlet holes 164 such that the two sets of holes are aligned with each other when in an assembled state. The illustrated outlet channel 172 comprises a plurality of fluid outlet holes 174 that are located along the outlet channel 172. The fluid outlet holes 174 extend fully through the outlet manifold layer 170. The fluid outlet holes 174 are larger in diameter than the fluid inlet holes 164 to accept the impingement jet nozzles such that fluid may flow from the second-pass heat transfer layer 114 through the fluid outlet holes 174 and around the impingement jet nozzles 161, as described in more detail below. The outlet manifold layer 170 may be made of a thermally conductive material, and may be manufactured using a variety of manufacturing processes.

The fluid outlet holes 174 are located in two rows that extend from the second end 175 toward the first end 173 that is opposite from the second end 175. In another embodiment, the plurality of fluid inlet holes may be arranged in a single row, or in more than two rows. Further, although the embodiment illustrated in FIGS. 1A, 4A and 4C have six fluid outlet holes 174, more or fewer fluid outlet holes 174 may be utilized.

As described above with respect to the inlet channel 162, the distance between the first end 173 where the coolant fluid exits the outlet channel 172 and the fluid outlet holes 174 varies from fluid outlet hole to fluid outlet hole. Because the distances between the first end 173 and the various fluid outlet holes are not equal, a coolant fluid chamber having straight walls would cause uneven coolant flow rates from each fluid outlet hole 174, as well as a relatively larger total pressure drop.

The outlet channel 172 also comprises a plurality of serpentine outlet channel walls 177 defined by a plurality of individual outlet spline features 178 that are located close to the fluid outlet holes 174. The shape and size of the serpentine outlet channel walls 177 and corresponding outlet spline features 178 are optimized to reduce the total pressure drop within the outlet channel 172, as well as provide for a uniform coolant fluid flow rate of coolant fluid flowing from each fluid outlet hole 174.

The shape of the outlet spline features 178 is dictated by the expected flow velocity field within the outlet channel 172. FIG. 4C illustrates expected coolant fluid flow within the outlet channel 172. The arrows indicate flow direction of the coolant fluid. The coolant fluid enters the outlet channel 172 through a ring-like opening defined by the fluid outlet holes 174 and around the impingement jet nozzles 161 (see FIGS. 7 and 8). The coolant fluid is then routed toward the first end 173 where it is forced upwardly through the coolant fluid outlet 166 of the inlet manifold layer 160 and the sealing layer fluid outlet 106 of the sealing layer 102, both of which are in fluid communication with the outlet channel 172.

The geometric shapes of the serpentine outlet channel walls 177 are designed to maintain substantially equal coolant fluid velocity and pressure at the fluid outlet holes despite the unequal distances between each fluid outlet hole 174 and the first end 173 where the coolant fluid exits the outlet channel 172. In such a manner, coolant fluid may be evenly and efficiently distributed throughout the outlet channel 172.

Figure 5A:
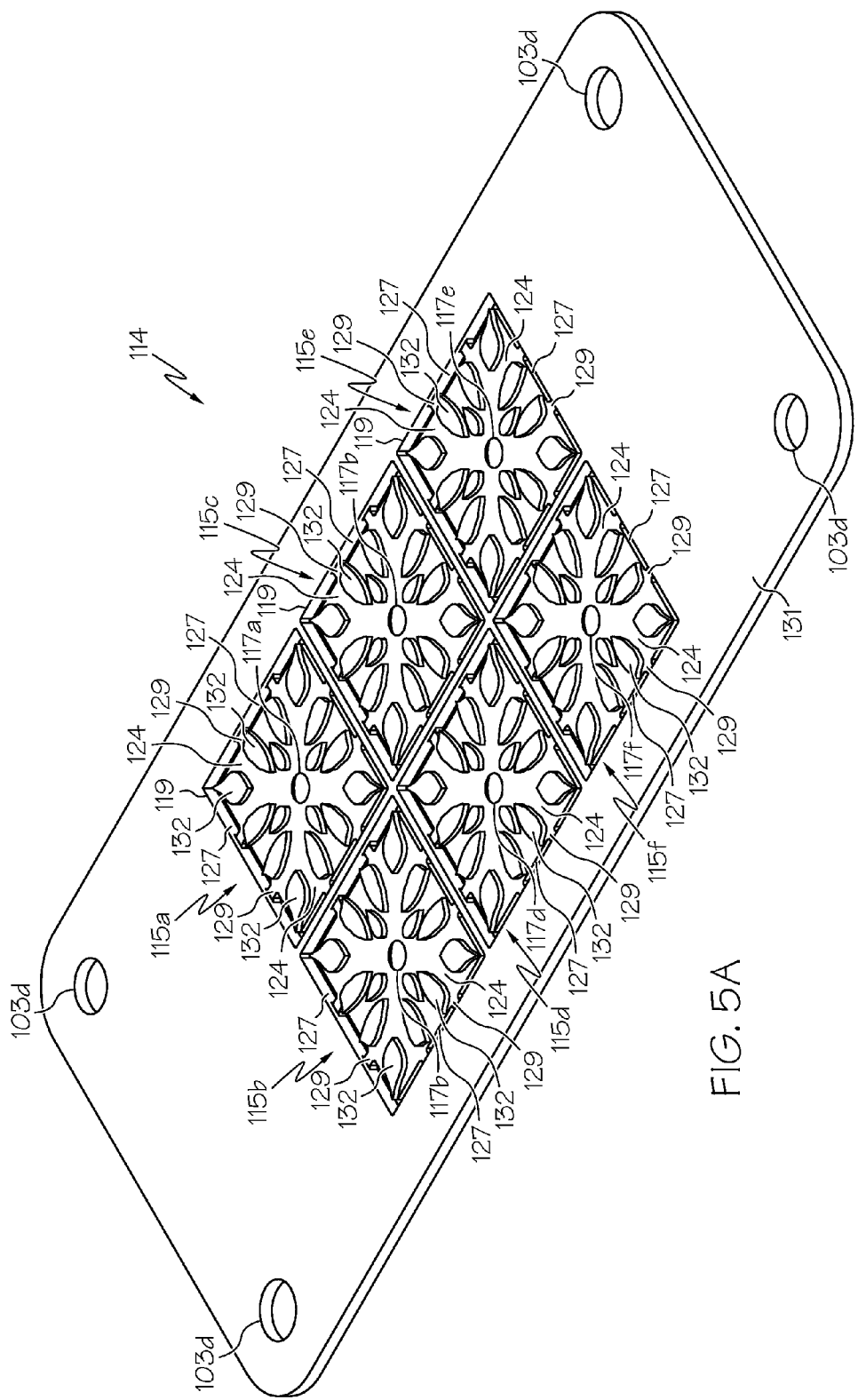
FIG. 5A schematically depicts a top perspective view of a second-pass heat transfer layer according to one or more embodiments shown and described herein.

Referring now to FIGS. 1A and 5A, the second-pass heat transfer layer 114 generally comprises a plurality of second-pass heat transfer cells 115a-115f, mounting holes 103d, and transition channels 127 located around the perimeter of each second-pass heat transfer cell 115a-115f. The number of second-pass heat transfer cells 115a-115f may depend on the number of fluid inlet holes 164 and fluid outlet holes 174 and is not limited to six as depicted in FIGS. 1A and 5A.

Each of the second-pass heat transfer cells comprises a plurality of radially-extending second-pass heat transfer layer microchannels 124 that are defined by a plurality of second-pass heat transfer layer fins 132. Each second-pass heat transfer cell further comprises a central fluid outlet region 117a-117f that comprises a hole of which an impingement jet nozzle is aligned with or positioned within. The hole of the central fluid outlet region 117a-117f may have a diameter that closely matches that of an inner diameter of the impingement jet nozzles. As shown in FIG. 8, in an alternative embodiment, the impingement jet nozzles may be integrally formed as hollow cylinders within the central fluid outlet region 117a-117f of the second-pass heat transfer cells 115a-115f, rather than integrally formed in the inlet manifold layer 160.

The radially-extending second-pass heat transfer layer microchannels 124 are defined by a plurality of second-pass heat transfer layer fins 132 of different shapes and sizes. The second-pass heat transfer layer fins 132 have curved walls and are geometrically optimized to reduce pressure drop, enhance heat transfer, and direct the coolant fluid toward a central fluid outlet region 117a-117f. The second-pass heat transfer layer fins 132 defining the second-pass heat transfer layer microchannels 124 have curved walls and vary in size and shape. By selecting the geometrical configuration of the second-pass heat transfer layer fins 132, the coolant fluid may more efficiently flow within the second-pass heat transfer layer microchannels 124. Curved walls also increase the surface area in which the coolant fluid is in contact with the second-pass heat transfer cells 115a-115f, thereby increasing thermal transfer from the second-pass heat transfer layer 114 to the coolant fluid. The geometric configuration of the second-pass heat transfer layer fins 132 and resulting second-pass heat transfer layer microchannels 124 positioned therebetween may be determined by computer simulation, for example. The geometric configuration utilized for the second-pass heat transfer layer microchannels 124 may depend on parameters such as flow resistance, the type of coolant fluid, and the desired maximum operating temperature of the power electronics device, for example.

The transition channels 127 extend fully through the second-pass heat transfer layer 114. In one embodiment, the second-pass heat transfer cells 115a-115f may be maintained by webbing features 129 that hold the second-pass heat transfer cells 115a-115f to a body of the second-pass heat transfer layer 114. The transition channels 127 may be configured as gaps between the webbing features 129. As described in more detail below, the transition channels 127 fluidly couple the second-pass heat transfer layer 114 to the target heat transfer layer 112.

Figure 5B:
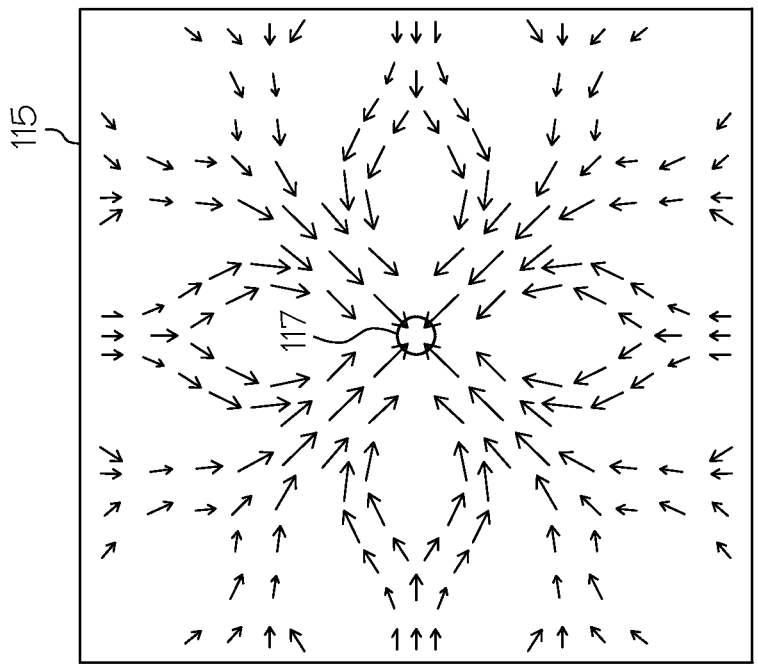
FIG. 5B schematically depicts a coolant fluid flow pattern of a second-pass heat transfer cell of the second-pass heat transfer layer depicted in FIG. 5A.

FIG. 5B illustrates a coolant fluid flow pattern of a single second-pass heat transfer cell 115. The coolant fluid flows from the perimeter to the central fluid outlet region 117. Fluid flow within the second-pass heat transfer layer 114 will be described in more detail below.

The second-pass heat transfer layer 114 may also be made of a thermally conductive material that allows for the transfer of thermal energy from the second-pass heat transfer layer 114 to the coolant fluid. It is noted that each layer may be made of a different thermally conductive material. As described above with respect to the sealing layer 102, exemplary materials include, but are not limited to, copper, aluminum, thermally enhanced composite materials, and polymer composite materials. The second-pass heat transfer layer 114 and corresponding components may also be formed by a molding process, a machining process, stamping process, or similar processes to achieve the desired shape and configuration. As an example and not a limitation, the second-pass heat transfer layer microchannels 124 may be formed by a machining process.

Figure 6A:
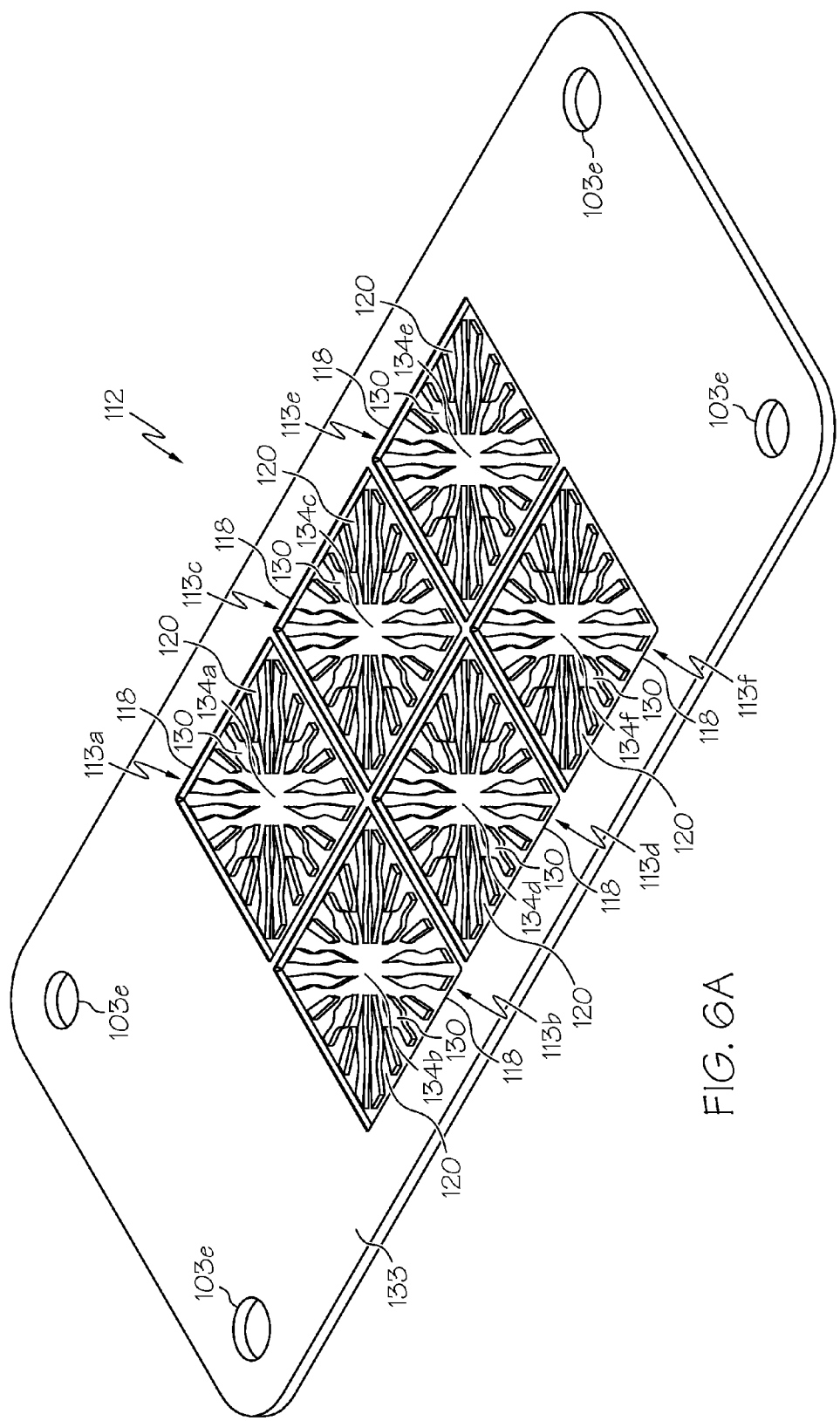
FIG. 6A schematically depicts a top perspective view of a target heat transfer layer according to one or more embodiments shown and described herein.

Referring now to FIGS. 1A and 6A, the target heat transfer layer 112 generally comprises mounting holes 103e and a plurality of target heat transfer cells 113a-113f. Each target heat transfer cell 113a-113f comprises an impingement region 134a-134f, target heat transfer cell walls 118, and a plurality of radially-extending target heat transfer layer microchannels 120. The radially-extending target heat transfer layer microchannels 120 are defined by a plurality of target heat transfer layer fins 130 of different shapes and sizes. Like the second-pass heat transfer layer fins 132, the target heat transfer layer fins 130 have curved walls and are geometrically optimized to reduce pressure drop, enhance heat transfer, and direct the coolant fluid toward the perimeter of the target heat transfer layer 112. By selecting the geometrical configuration of the target heat transfer layer fins 130, the coolant fluid may more efficiently flow within the target heat transfer layer microchannels 120. Curved walls also increase the surface area in which the coolant fluid is in contact with the target heat transfer layer 112, thereby increasing thermal transfer from the target heat transfer layer 112 to the coolant fluid. The geometric configuration of the target heat transfer layer fins 130 and resulting target heat transfer layer microchannels 120 positioned therebetween may also be determined by computer simulation. The geometric configuration utilized for the target heat transfer layer microchannels 120 may depend on parameters such as flow resistance, the type of coolant fluid, and the desired maximum operating temperature of the power electronics device, for example.

Figure 6B:
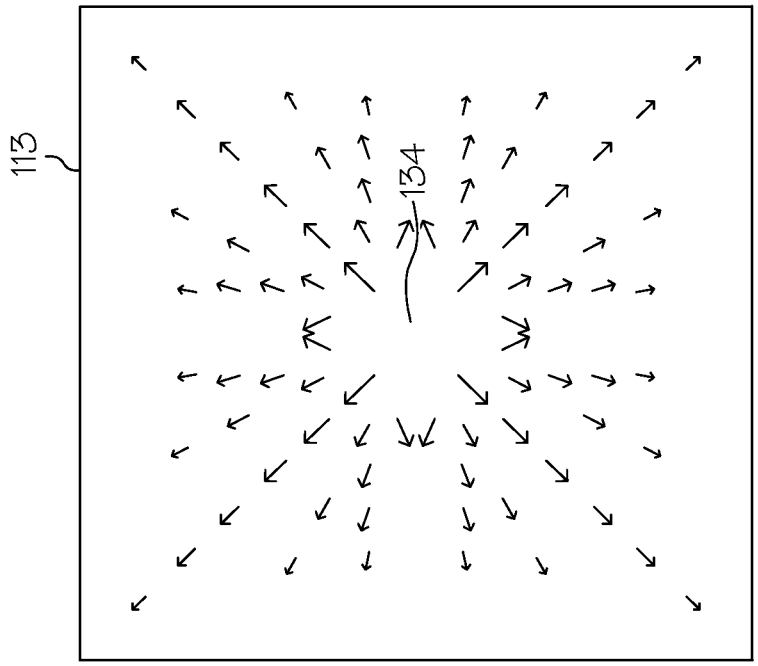
FIG. 6B schematically depicts a coolant fluid flow pattern of a target heat transfer cell of the target heat transfer layer depicted in FIG. 6A.

The impingement region 134a-134f is the central portion of the target heat transfer cell 113a-113f that the jet of coolant fluid strikes. After striking the impingement region 134, the coolant fluid flows outwardly through the target heat transfer layer microchannels 120 toward the target heat transfer cell walls 118. The target heat transfer cell walls 118 maintain the coolant fluid within the target layer cell. Referring to FIG. 6B, a coolant fluid flow pattern of a target heat transfer cell is illustrated. The coolant fluid flows from the impingement region 134 to the perimeter of the target heat transfer cell 113.

The target heat transfer layer 112 may also be made of a thermally conductive material that allows for the transfer of thermal energy from the target heat transfer layer 112 to the coolant fluid. The thermally conductive material may be those described above. The target heat transfer layer 112 and corresponding components may also be formed by a molding process, a machining process, stamping process, or similar processes to achieve the desired shape and configuration.

It is noted that the pattern defined by the target heat transfer layer microchannels 120 is different from the pattern defined by the second-pass heat transfer layer microchannels 124. The different patterns result from the difference in direction of fluid flow within the two layers. It is also noted that the second-pass heat transfer layer fins 132 differ in size and geometric configuration than those of the target heat transfer layer fins 130. It should be understood that target layer microchannel patterns and heat transfer layer microchannel patterns other than those illustrated in FIG. 1 may be utilized.

Figure 7:
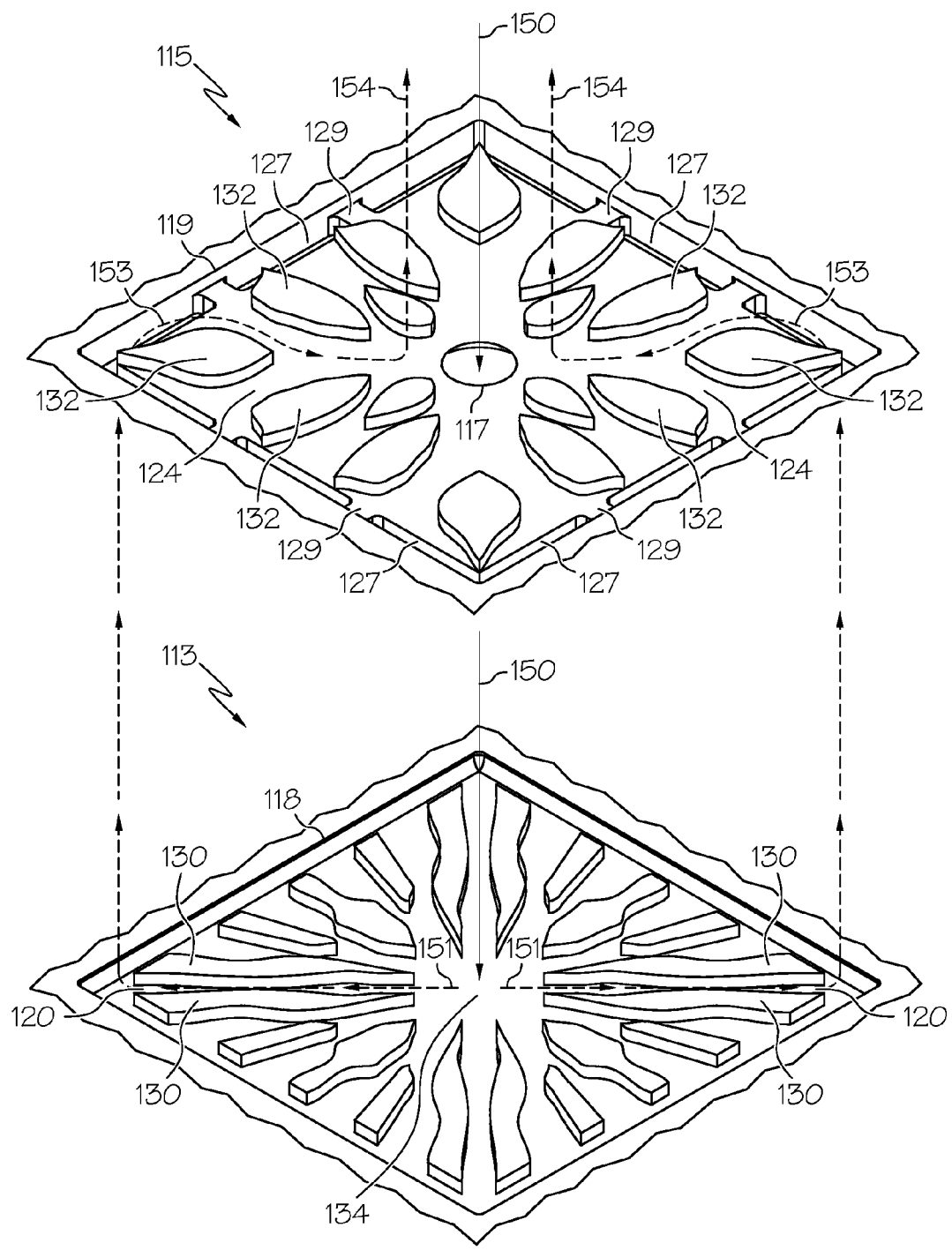
FIG. 7 schematically depicts a partial exploded perspective view of a second-pass heat transfer layer and a target heat transfer layer according to one or more embodiments shown and described herein.

Operation of the cold plate assembly 100 will now be described with general reference to FIGS. 1A, 7 and 8. In one embodiment, one or more power electronics devices (e.g., power electronics devices 290 illustrated in FIG. 8) may be thermally coupled to a surface of the target heat transfer layer 112 (e.g., via a substrate layer 280 illustrated in FIG. 8). The power electronics device 290 may be one or more semiconductor devices that may include, without limitation, IGBTs, RC-IGBTs, MOSFETs, power MOSFETs, diodes, transistors, and/or combinations thereof (e.g., power cards). As an example, the power electronics device or devices may be used in a vehicular electrical system, such as in hybrid-electric or electric vehicles (e.g., in an inverter system). Such power electronics devices may generate significant heat flux when propelling a vehicle. It should be understood that the cold plate assemblies described herein may also be utilized in other applications and are not limited to vehicular applications.

Heat flux generated by a power electronics device coupled to a surface of the target heat transfer layer 112 is transferred to the cold plate assembly 100 through the target heat transfer layer 112, and the second-pass heat transfer layer 114, as well as the inlet manifold layer 160 and the outlet manifold layer 170. Coolant fluid may be introduced into the cold plate assembly 100 through a coolant fluid line (not shown) and the coolant fluid inlet 105 at the sealing layer 102. The coolant fluid then enters the inlet channel 162 via the coolant fluid inlet 105 and optimally flows toward each of the fluid inlet holes 164 at a substantially uniform flow rate. The coolant fluid flows through the impingement jet nozzles 161 (e.g., impingement jet nozzles 161 illustrated in FIG. 3B or impingement jet nozzles 261 illustrated in FIG. 8) where it passes through the fluid outlet holes 174 of the outlet manifold layer 170 and the central fluid outlet region 117 of the second-pass heat transfer layer 114 and impinges the impingement region 134a-134f of the target heat transfer cells 113a-113f within the target heat transfer layer 112. Referring specifically to FIG. 7, the jet of coolant fluid (illustrated by arrow 150) impinges a target heat transfer cell 113 at impingement region 134. Heat flux is transferred from the power electronics device to the coolant fluid at the impingement region 134. Preferably, the impingement region 134 is centered on a local hot spot of the power electronics device such that this area of the power electronics device receives the impingement of coolant fluid.

The coolant fluid then changes direction to a flow direction that is normal to the jet of coolant fluid 150. The coolant fluid flows radially toward the perimeter of the target heat transfer cell 113 through the radially-extending target heat transfer layer microchannels 120, as indicated by arrows 151. Therefore, the coolant fluid flows over the surface of the target heat transfer layer 112 and is in contact with the various target heat transfer layer fins 130 of each target heat transfer cell to convectively and conductively transfer heat flux from the target heat transfer layer 112 to the coolant fluid. It should be understood that coolant fluid may flow through all of the target heat transfer layer microchannels 120 (and second-pass heat transfer layer microchannels 124) and that the arrows provided in FIG. 7 are for illustrative purposes only.

The coolant fluid then reaches the walls 118 of each target heat transfer cell 113 where it is then forced into the transition channels 127 of the second-pass heat transfer cells 115. The coolant fluid changes direction and flows within the transition channels 127 such that it travels in a direction that is normal to the direction of coolant flow within the target heat transfer cells 113. Enhanced thermal mixing occurs within the transition channel, which further increases heat transfer by convection.

After flowing into and out of the transition channels 127, the coolant fluid then is forced into the second-pass heat transfer cells 115a-115f where it flows in a direction that is 180 degrees from the flow direction in the target heat transfer cells. The coolant fluid flows from the perimeter toward the central fluid outlet region 117a-117f of each second-pass heat transfer cell 115a-115f as indicated by arrows 153. The coolant fluid therefore makes a second pass over the second-pass heat transfer layer 114 through second-pass the second-pass heat transfer layer microchannels 124, and continues to receive heat flux from the power electronics device. After flowing through the second-pass heat transfer layer microchannels 124, the coolant fluid exits the second-pass heat transfer cells as indicated by arrows 154. The coolant fluid concentrically flows through the fluid outlet holes 174 with respect to the impingement jet nozzles 161 positioned within each fluid outlet hole 174. The coolant fluid then flows from each fluid outlet hole 174 toward the first end 173 of the outlet channel 172, where it is forced into the coolant fluid outlet 166 and the sealing layer fluid outlet 106. The warmed coolant fluid exits the cold plate assembly 100 and may be cooled in a secondary recirculation loop, such as an automotive radiator, for example.

Referring now to FIG. 8, an alternative embodiment of a cold plate assembly 200 is illustrated. As shown in FIG. 8, the cold plate assembly 200 comprises a sealing layer 202, an inlet manifold layer 260, an outlet manifold layer 270, a second-pass heat transfer layer 214, and a target heat transfer layer 212. A plurality of power electronics devices 290 may be thermally coupled to the target heat transfer layer 212 by one or more thermally conductive substrate layers 280. The power electronics devices 290, cold plate assembly 200, and the thermally conductive substrate layers 280 may be coupled together by solder, brazing or other thermal coupling methods. The power electronics devices coupled to a cold plate assembly may be referred to as a power electronics module.

The sealing layer 202 may comprises a coolant fluid inlet and sealing layer coolant fluid outlet, or the coolant fluid inlet and coolant fluid outlet may be provided within the inlet manifold layer 260 and outlet manifold layer 270, respectively, as depicted in FIG. 8. The inlet manifold layer 260 illustrated in FIG. 8 comprises a first inlet channel 262a and a second inlet channel 262b, with each inlet channel having fluid inlet holes as described above. Therefore, the inlet manifold layer 260 of the embodiment of FIG. 8 includes an additional inlet channel 262b with additional fluid inlet holes compared with the inlet manifold layer 160 depicted in FIGS. 1A and 3A-3C. The first inlet channel 262a illustrated in FIG. 8 further comprises a side coolant fluid inlet slot 268 through which to receive coolant fluid. It should be understood that the coolant fluid inlet configuration illustrated in FIG. 1A, as well as other coolant fluid inlet configurations, may be utilized. The second inlet channel 262b further comprises a coupling slot 267 that is used to fluidly couple the second inlet channel 262b to a first outlet channel 272a of the outlet manifold layer 270.

The outlet manifold layer 270 comprises a first outlet channel 272a and a second outlet channel 272b, with each outlet channel having a plurality of fluid outlet holes such that the outlet manifold layer 270 depicted in FIG. 8 has an additional outlet channel 272b and additional fluid outlet holes compared with the outlet manifold layer 170 depicted in FIGS. 1A and 4A-4C. The first outlet channel 272a further comprises a coupling channel 277 that is fluidly coupled to the second inlet channel 262b via the coupling slot 267. The second outlet channel 272b further comprises a side coolant fluid outlet slot 278 through which warmed coolant fluid may exit the cold plate assembly 200. It should be understood that the coolant fluid outlet configuration as illustrated in FIG. 1A, as well as other coolant fluid outlet configurations, may be utilized.

The second-pass heat transfer layer 214 comprises first second-pass heat transfer cells 215a-215f and additional second-pass heat transfer cells 215g-215l. Further, in the illustrated embodiment, each additional second-pass heat transfer cell comprises an impingement jet nozzle 261 that is centrally located within each additional second-pass heat transfer cell. Therefore, the impingement jet nozzles 261 are located on the second-pass heat transfer layer 214 rather than the inlet manifold layer as depicted in FIG. 3B. When fully assembled, the impingement jet nozzles 261 are positioned within the fluid outlet holes and the fluid inlet holes of the outlet manifold layer 270 and the inlet manifold layer 260, respectively.

The target heat transfer layer 212 comprises first target heat transfer cells 213a-213f and second, additional target heat transfer cells 213g-213l. Each of the illustrated layers are thermally coupled together to form a stack defining the cold plate assembly 200. It is noted that the layers need not be made of the same thermally conductive material. Coolant fluid is introduced into the first inlet channel 262a (e.g., via the side coolant fluid inlet slot 268) where it flows through each of the inlet holes associated with the first inlet channel 262a and the impingement jet nozzles 261 associated with the first second-pass heat transfer cells 215a-215f. The coolant fluid strikes the first target heat transfer cells 213a-213f and is redirected into the first second-pass heat transfer cells 215a-215f as described above. The coolant fluid flows toward the central fluid outlet region of each first second-pass heat transfer cell 215a-215f, through the fluid outlet holes of the first outlet channel 272a, and around the impingement jet nozzles 261. The coolant fluid then flows through the coupling channel of the first outlet channel 272a and into the second inlet channel 262b through coupling slot 267.

After entering the second inlet channel 262b, the coolant fluid follows a similar path as described with respect to the first inlet channel 262a, the first target heat transfer cells 213a-213f, the first second-pass heat transfer cells 215a-215f, and the first outlet channel 272a. The coolant fluid flows through each of the inlet holes associated with the second inlet channel 262b and the impingement jet nozzles 261 associated with the additional second-pass heat transfer cells 215g-215l. The coolant fluid strikes the additional target heat transfer cells 213g-213l and is redirected into the additional second-pass heat transfer cells 215g-215l as described above. The coolant fluid flows toward the central fluid outlet region of each additional second-pass heat transfer cell 215g-215l, through the fluid outlet holes of the second outlet channel 272b, and around the impingement jet nozzles 261. The coolant fluid then flows out of the cold plate assembly 200 through the side coolant fluid outlet slot 278. Additional cold plate assembly stacks may be further coupled together in series as desired to increase heat transfer within specified pumping power limits.

It should now be understood that the embodiments of the cold plate assemblies and power electronics modules described herein may be utilized to efficiently remove heat generated by a heat generating device by conductive and convective heat transfer with low pressure drops using optimized fluid inlet and outlet manifold layers and multi-pass structures. Heat produced by the heat generating device may be removed by conductive and convective transfer by normal jet impingement on the target layer, geometrically optimized fins, enhanced fluid mixing at transition channels, and optimized microchannels for greater surface area and an enlarged heat transfer path. Optimized inlet channel and outlet channel walls provide uniform flow rates with low pressure drops.

It is noted that the term "substantially" may be utilized herein to represent the inherent degree of uncertainty that may be attributed to any quantitative comparison, value, measurement, or other representation. This term is also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A cold plate assembly comprising:
    a coolant fluid inlet;
    an inlet manifold layer comprising a coolant fluid outlet and an inlet channel, the inlet channel comprising a plurality of fluid inlet holes fluidly coupled to a plurality of impingement jet nozzles, wherein at least two fluid inlet holes of the plurality of fluid inlet holes are separated from the coolant fluid inlet by an unequal distance, and an inlet coolant fluid flow rate of a coolant fluid at each fluid inlet hole is substantially uniform;
    a target heat transfer layer comprising a plurality of target heat transfer cells, each target heat transfer cell comprising a plurality of target heat transfer layer fins that define a plurality of target heat transfer layer microchannels extending in a radial direction from a central impingement region;
    a second-pass heat transfer layer comprising a plurality of second-pass heat transfer cells, each second-pass heat transfer cell comprising a plurality of second-pass heat transfer layer fins that define a plurality of second-pass heat transfer layer microchannels extending in a radial direction toward a central fluid outlet region, and one or more transition channels positioned at a perimeter of each second-pass heat transfer cell, wherein:
        the second-pass heat transfer layer is thermally coupled to the target heat transfer layer;
        the transition channels fluidly couple the second-pass heat transfer layer to the target heat transfer layer; and
        the plurality of impingement jet nozzles is positioned to direct fluid through the central fluid outlet region of the second-pass heat transfer cells; and
    an outlet manifold layer comprising an outlet channel, the outlet channel comprising a plurality of fluid outlet holes, wherein:
        the outlet manifold layer is thermally coupled to the second-pass heat transfer layer and the inlet manifold layer;
        the outlet channel is fluidly coupled to the coolant fluid outlet; and
        the plurality of impingement jet nozzles passes through the plurality of fluid outlet holes.

2. The cold plate assembly of claim 1 wherein the coolant fluid flows from the plurality of impingement jet nozzles, impinges the target heat transfer layer at the central impingement region of each target heat transfer cell, and flows outwardly toward a perimeter of each target heat transfer cell through the plurality of target heat transfer layer microchannels.

3. The cold plate assembly of claim 1 wherein the coolant fluid flows from the target heat transfer layer to the second-pass heat transfer layer through the transition channels, and flows toward the central fluid outlet region of the second-pass heat transfer cells through the second-pass heat transfer layer microchannels.

4. The cold plate assembly of claim 1 wherein the coolant fluid flows from the heat transfer layer to the outlet manifold layer through the fluid outlet holes at an outlet coolant fluid flow rate that is substantially uniform at each fluid outlet hole.

5. The cold plate assembly of claim 1 wherein:
    the inlet manifold layer further comprises a plurality of serpentine inlet channel walls along a perimeter of the inlet channel, wherein each serpentine inlet channel wall comprises an inlet spline feature located proximate to an individual fluid inlet hole; and
    the outlet manifold layer further comprises a plurality of serpentine outlet channel walls along a perimeter of the outlet channel, wherein each serpentine outlet channel wall comprises an outlet spline feature located proximate to an individual fluid outlet hole.

6. The cold plate assembly of claim 1 wherein the inlet spline features and the outlet spline features are geometrically optimized such that a total pressure drop within the inlet channel and the outlet channel is less than about 2 kPa.

7. The cold plate assembly of claim 1 wherein the plurality of fluid inlet holes and the plurality of fluid outlet holes are arranged within the inlet channel and the outlet channel, respectively, in at least two rows such that the fluid inlet holes are concentrically aligned with the fluid outlet holes.

8. The cold plate assembly of claim 1 further comprising a sealing layer thermally coupled to the inlet manifold layer, wherein the sealing layer comprises the coolant fluid inlet and a sealing layer coolant fluid outlet that is fluidly coupled to the coolant fluid outlet of the inlet manifold layer.

9. The cold plate assembly of claim 1 wherein the plurality of impingement jet nozzles is integral with the inlet manifold layer and is fluidly coupled to the plurality of fluid inlet holes.

10. The cold plate assembly of claim 1 wherein the target heat transfer layer fins and the second-pass heat transfer layer fins comprise curved walls.

11. The cold plate assembly of claim 10 wherein the curved walls of the target heat transfer layer fins and the second-pass heat transfer layer fins are shaped for optimized convective heat transfer between the coolant fluid and the target heat transfer layer fins and the second-pass heat transfer layer fins.

12. The cold plate assembly of claim 1 wherein a target heat transfer layer microchannel pattern that is defined by the plurality of target heat transfer surface layer microchannels is different from a second-pass the heat transfer layer microchannel pattern that is defined by the plurality of second-pass heat transfer layer microchannels.

13. The cold plate assembly of claim 1 wherein the transition channels are normal to the plurality of target heat transfer layer microchannels and the plurality of second-pass heat transfer layer microchannels.

14. The cold plate assembly of claim 1 wherein an individual fluid outlet hole is concentric with respect to an individual impingement jet nozzle.

15. The cold plate assembly of claim 1 wherein:
the inlet manifold layer further comprises an additional inlet channel, the inlet channel comprising an additional fluid inlet;
the target heat transfer layer comprises a plurality of additional target heat transfer cells;
the second-pass heat transfer layer comprises a plurality of additional second-pass heat transfer cells;
the outlet manifold layer further comprises an additional outlet channel;
the outlet channel further comprises a coupling channel that is fluidly coupled to the additional fluid inlet; and
the additional outlet channel is fluidly coupled to the coolant fluid outlet.

16. The cold plate assembly of claim 15 wherein the coolant fluid first enters the inlet channel and flows through the plurality of target heat transfer cells, the plurality of second-pass heat transfer cells, and the outlet channel, and subsequently flows through the additional inlet channel, the plurality of additional target heat transfer cells, the plurality of additional second-pass heat transfer cells, and the additional outlet channel.

17. A power electronics module comprising:
a cold plate assembly comprising:
  a coolant fluid inlet;
  an inlet manifold layer comprising a coolant fluid outlet and an inlet channel, the inlet channel comprising a plurality of fluid inlet holes fluidly coupled to a plurality of impingement jet nozzles, wherein at least two fluid inlet holes of the plurality of fluid inlet holes are separated from the coolant fluid inlet by an unequal distance, and an inlet coolant fluid flow rate of a coolant fluid at each fluid inlet hole is substantially uniform;
  a target heat transfer layer comprising a plurality of target heat transfer cells, each target heat transfer cell comprising a plurality of target heat transfer layer fins that define a plurality of target heat transfer layer microchannels extending outwardly in a radial direction from a central impingement region;
  a second-pass heat transfer layer comprising a plurality of second-pass heat transfer cells, each second-pass heat transfer cell comprising a plurality of second-pass heat transfer layer fins that define a plurality of second-pass heat transfer layer microchannels extend inwardly in a radial direction toward a central fluid outlet region, and one or more transition channels positioned between each second-pass heat transfer cell, wherein:
    the second-pass heat transfer layer is thermally coupled to the target heat transfer layer;
    the transition channels fluidly couple the second-pass heat transfer layer to the target heat transfer layer; and
    the plurality of impingement jet nozzles is positioned through the central fluid outlet region of the second-pass heat transfer cells; and
  an outlet manifold layer comprising an outlet channel, the outlet channel comprising a plurality of fluid outlet holes, wherein:
    the outlet manifold layer is thermally coupled to the second-pass heat transfer layer and the inlet manifold layer;
    the outlet channel is fluidly coupled to the coolant fluid outlet; and
    the plurality of impingement jet nozzles passes through the plurality of fluid outlet holes;

a substrate layer coupled to a backside of the target heat transfer layer;
a power electronics device coupled to the substrate layer, wherein heat generated by the power electronics device is transferred to the coolant fluid within the cold plate assembly at least through the substrate layer and the target heat transfer layer.

18. The power electronics module of claim 17 wherein:
the inlet manifold layer further comprises a plurality of serpentine inlet channel walls along a perimeter of the inlet channel, wherein each serpentine inlet channel wall comprises an inlet spline feature located proximate to an individual fluid inlet hole; and
the outlet manifold layer further comprises a plurality of serpentine outlet channel walls along a perimeter of the outlet channel, wherein each serpentine outlet channel wall comprises an outlet spline feature located proximate to an individual fluid outlet hole.

19. The power electronics module of claim 17 wherein:
the target heat transfer layer fins and the second-pass heat transfer layer fins comprise one or more curved walls; and
a target heat transfer layer microchannel pattern that is defined by the plurality of target heat transfer layer microchannels is different from a second-pass heat transfer layer microchannel pattern that is defined by the plurality of second-pass heat transfer layer microchannels.

20. A cold plate assembly comprising:
an inlet manifold layer comprising a coolant fluid outlet and an inlet channel, the inlet channel comprising a plurality of fluid inlet holes fluidly coupled to a plurality of impingement jet nozzles, and a plurality of serpentine inlet channel walls;
a target heat transfer layer comprising a plurality of target heat transfer cells, each target heat transfer cell comprising a plurality of target heat transfer layer fins having curved walls that define a plurality of target heat transfer layer microchannels extending outwardly in a radial direction from a central impingement region;
a second-pass heat transfer layer comprising a plurality of second-pass heat transfer cells, each second-pass heat transfer cell comprising a plurality of second-pass heat transfer layer fins having curved walls that define a plurality of second-pass heat transfer layer microchannels extending inwardly in a radial direction toward a central fluid outlet region, and one or more transition channels positioned between each second-pass heat transfer cell, wherein:
  the second-pass heat transfer layer is thermally coupled to the target heat transfer layer;
  the transition channels fluidly couple the second-pass heat transfer layer to the target heat transfer layer; and
  the plurality of impingement jet nozzles is positioned through the central fluid outlet region of the second-pass heat transfer cells; and
an outlet manifold layer comprising an outlet channel, the outlet channel comprising a plurality of fluid outlet holes and a plurality of serpentine outlet channel walls, wherein:
  the outlet manifold layer is thermally coupled to the second-pass heat transfer layer and the inlet manifold layer;
  the outlet channel is fluidly coupled to the coolant fluid outlet;
  the plurality of impingement jet nozzles passes through the plurality of fluid outlet holes; and a target heat transfer layer microchannel pattern that is defined by the plurality of target heat transfer layer microchannels is different from a second-pass heat transfer layer microchannel pattern that is defined by the plurality of second-pass heat transfer layer microchannels.

\* \* \* \* \*